(12) United States Patent
Gilberton et al.

(10) Patent No.: US 8,036,301 B2
(45) Date of Patent: Oct. 11, 2011

(54) RADIO TRANSMITTER WITH REDUCED POWER CONSUMPTION

(75) Inventors: Philippe Gilberton, Chantepie (FR); Vincent Demoulin, Montfort sur Meu (FR)

(73) Assignee: Thomson Licensing, Boulogne-Billancourt (FR)

( * ) Notice: Subject to any disclaimer, the term of this patent is extended or adjusted under 35 U.S.C. 154(b) by 786 days.

(21) Appl. No.: 10/589,174

(22) PCT Filed: Feb. 9, 2005

(86) PCT No.: PCT/EP2005/050571
§ 371 (c)(1),
(2), (4) Date: Aug. 11, 2006

(87) PCT Pub. No.: WO2005/081413
PCT Pub. Date: Sep. 1, 2005

(65) Prior Publication Data
US 2007/0140362 A1 Jun. 21, 2007

(30) Foreign Application Priority Data
Feb. 13, 2004 (EP) .................................. 04290407

(51) Int. Cl.
*H04L 27/20* (2006.01)
*H04L 25/06* (2006.01)
*H04L 27/36* (2006.01)

(52) U.S. Cl. ......... 375/295; 375/297; 375/298; 375/308

(58) Field of Classification Search .......... 375/295–297, 375/285, 298, 308, 261, 279–281; 330/296, 330/10, 136, 295, 252, 261, 278, 285; 455/522, 455/126, 127.1, 272.2, 272.3; 332/107, 149, 332/159, 160
See application file for complete search history.

(56) References Cited

U.S. PATENT DOCUMENTS

| | | | | |
|---|---|---|---|---|
| 5,045,816 A * | 9/1991 | Bramhall et al. | ............. | 332/105 |
| 5,225,902 A * | 7/1993 | McMullan, Jr. | ............. | 725/121 |
| 5,655,220 A * | 8/1997 | Weiland et al. | ................ | 455/69 |
| 6,107,880 A * | 8/2000 | Shaw | ............................ | 330/136 |
| 6,194,968 B1 * | 2/2001 | Winslow | ........................ | 330/289 |
| 6,281,748 B1 * | 8/2001 | Klomsdorf et al. | ........... | 330/129 |
| 6,351,189 B1 * | 2/2002 | Hirvilampi | ................... | 330/296 |
| 6,445,247 B1 * | 9/2002 | Walker | .......................... | 330/10 |

(Continued)

FOREIGN PATENT DOCUMENTS
EP 0673112 9/1995

OTHER PUBLICATIONS

Search Report Dated Apr. 5, 2005.

*Primary Examiner* — Tesfaldet Bocure
(74) *Attorney, Agent, or Firm* — Robery D. Shedd; Joseph J. Opalach; Brian J. Cromarty

(57) ABSTRACT

A technique for controlling a transmitter apparatus is useful for reducing power consumption, and may be particularly applicable to portable apparatuses such as mobile transceivers which employ a battery power supply. According to an exemplary embodiment, the transmitter apparatus includes a power amplifier for amplifying a transmission signal. A processor controls the power amplifier based on a type of digital modulation associated with the transmission signal.

14 Claims, 4 Drawing Sheets

U.S. PATENT DOCUMENTS

| | | | |
|---|---|---|---|
| 6,631,268 B1 * | 10/2003 | Lilja | 455/450 |
| 6,646,600 B2 * | 11/2003 | Vail et al. | 342/372 |
| 7,308,042 B2 * | 12/2007 | Jin et al. | 375/297 |
| 7,333,563 B2 | 2/2008 | Chan et al. | 375/297 |
| 7,368,985 B2 * | 5/2008 | Kusunoki | 330/10 |
| 7,471,154 B2 * | 12/2008 | Thompson | 330/295 |
| 7,493,093 B2 * | 2/2009 | Boerman et al. | 455/126 |
| 2002/0013157 A1 * | 1/2002 | Ichikawa | 455/522 |
| 2002/0132652 A1 * | 9/2002 | Steel et al. | 455/574 |
| 2002/0153956 A1 * | 10/2002 | Wojslaw | 330/296 |
| 2003/0201829 A1 | 10/2003 | Hageman et al. | |

* cited by examiner

RADIO TRANSMITTER WITH REDUCED POWER CONSUMPTION

This application claims the benefit, under 35 U.S.C. §365 of International Application PCT/EP05/050571, filed Feb. 9, 2005, which was published in accordance with PCT Article 21(2) on Sep. 1, 2005 in English and which claims the benefit of European patent application No. 04290407.8, filed Feb. 13, 2004.

The present invention generally relates to transmitter apparatuses, and more particularly, to a technique for controlling the power consumption of a transmitter apparatus. The present invention may be particularly applicable to portable apparatuses such as mobile transceivers which utilize a battery power supply.

Certain communication standards may require apparatuses to support a plurality of different types of signal modulation. For example, wireless communication standards such as Hiperlan2, IEEE 802.11a, DVB-T and/or other standards specify different types of modulation to be used depending on the data transmission rate employed. Table 1 below shows exemplary types of modulation and corresponding data transmission rates that may be specified by such communication standards.

TABLE 1

| Modulation Type | Data Transmission Rate (Mbps) |
| --- | --- |
| BPSK ½ | 6 |
| BPSK ¾ | 9 |
| QPSK ½ | 12 |
| QPSK ¾ | 18 |
| 16 QAM ½ | 24 |
| 16 QAM ¾ | 36 |
| 64 QAM ⅔ | 48 |
| 64 QAM ¾ | 54 |

The modulation types shown in Table 1 employ the general principles of Orthogonal Frequency Division Multiplexing modulation (OFDM), which may require the use of a power amplifier for signal transmission having a linear relationship between input power and output power. To satisfy this linearity requirement, such amplifiers typically require a high bias current during a transmitting mode, and may therefore consume a relatively large amount of power. For example, a power amplifier having a gain of 10 dB may require a bias current of 150 mA or more during the transmitting mode in order to operate at 5 GHz, which is a typical frequency range for communication standards such as Hiperlan2 and IEEE 802.11a. This requirement of a high bias current for the power amplifier may significantly increase the overall power consumption of an apparatus during the transmitting mode. For example, with an apparatus such as a mobile transceiver, the peak power consumed by the power amplifier may constitute 70% or more of the total power consumption of the apparatus during the transmitting mode. Accordingly, the power amplifier used for signal transmission may consume a large of amount of power, which may be particularly problematic for portable apparatuses such as mobile transceivers that utilize a battery power supply. Moreover, the power consumption of the power amplifier may also cause the apparatus to generate heat in an undesirable manner.

Accordingly, there is a need for a technique for controlling transmitter apparatuses which avoids the foregoing problems, and thereby reduces power consumption. The present invention may address these and/or other issues.

In accordance with an aspect of the present invention, an apparatus having a signal transmission function is disclosed. According to an exemplary embodiment, the apparatus comprises amplifying means for amplifying a transmission signal. Processing means are provided for controlling the amplifying means based on a type of digital modulation associated with the transmission signal.

In accordance with another aspect of the present invention, a method for controlling a transmitter apparatus is disclosed. According to an exemplary embodiment, the method comprises steps of identifying a type of digital modulation for a transmission signal, and controlling power amplification of the transmission signal based on the type of digital modulation.

The above-mentioned and other features and advantages of this invention, and the manner of attaining them, will become more apparent and the invention will be better understood by reference to the following description of embodiments of the invention taken in conjunction with the accompanying drawings, wherein.

The exemplifications set out herein illustrate preferred embodiments of the invention, and such exemplifications are not to be construed as limiting the scope of the invention in any manner.

Figure 1:
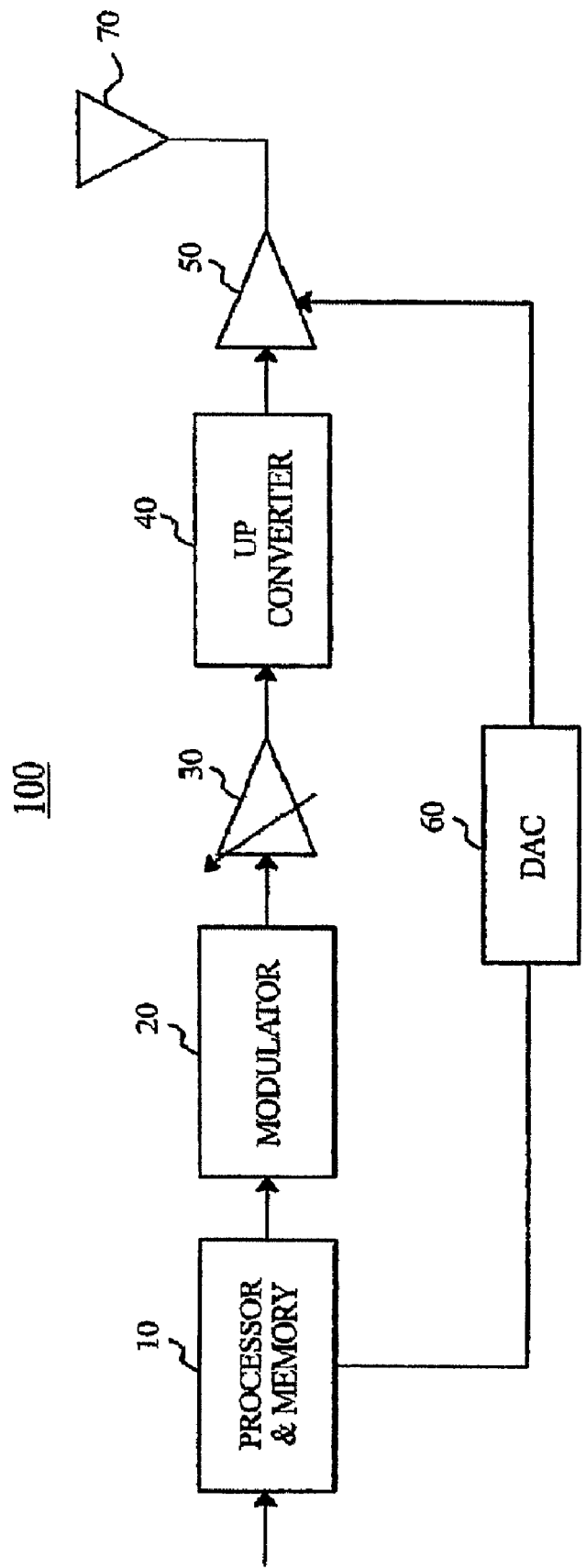
FIG. 1 is a block diagram of a transmitter apparatus according to an exemplary embodiment of the present invention.

Referring now to the drawings, and more particularly to FIG. 1, a transmitter apparatus 100 according to an exemplary embodiment of the present invention is shown. In FIG. 1, transmitter apparatus 100 comprises processing and memory means such as processor and memory 10, modulating means such as modulator 20, variable amplifying means such as variable gain amplifier (VGA) 30, frequency converting means such as frequency up converter 40, power amplifying means such as power amplifier 50, digital-to-analog converting means such as digital-to-analog converter (DAC) 60, and signal transmitting means such as signal transmitting element 70. Some of the foregoing elements of FIG. 1 may for example be embodied using one or more integrated circuits (ICs). For clarity of description, certain conventional elements associated with transmitter apparatus 100 such as control signals, power signals, and/or other conventional elements may not be shown in FIG. 1. According to an exemplary embodiment, transmitter apparatus 100 of FIG. 1 may be part of a transceiver apparatus which also includes signal receiving and processing elements not shown in FIG. 1. For example, transmitter apparatus 100 may be part of a mobile wireless transceiver such as a telephone, pager, personal digital assistant (PDA) and/or other device.

Processor and memory 10 are operative to perform various functions including processing, control and data storage functions. According to an exemplary embodiment, processor 10 is operative to process baseband signals such as audio, video, text and/or other types of input signals, and thereby generate processed signals. Processor 10 is further operative to identify a type of digital modulation to be used for a transmission signal of transmitter apparatus 100. According to an exemplary embodiment, processor 10 identifies the type of digital modulation to be used for a transmission signal by detecting and processing data included within one or more data frames provided from signal receiving and processing elements (not shown in FIG. 1) associated with transmitter apparatus 100. The type of digital modulation used by transmitter apparatus 100 may for example change based on factors such as transmission range, the amount of data to be transmitted, and/or other factors. Memory 10 is operative to store data including digital values which may be retrieved by processor 10 and used to control power amplifier 50.

Modulator 20 is operative to modulate the processed signals provided from processor 10, and thereby generate modulated signals. According to an exemplary embodiment, modulator 20 is operative to perform a plurality of different types of modulation including various types of OFDM, such as the types of bi-phase shift keyed (BPSK) modulation, quadrature phase shift keyed (QPSK) modulation, and/or quadrature amplitude modulation (QAM) shown in Table 1 herein. Accordingly, modulator 20 may be operative to process I and Q signals. Although not expressly indicated in FIG. 1, the type of modulation performed by modulator 20 may be adaptively controlled by a control signal provided from a processor, such as processor 10.

VGA 30 is operative to variably amplify the modulated signals provided from modulator 20, and thereby generate amplified signals. Although not expressly indicated in FIG. 1, the gain of VGA 30 may be adaptively controlled by a control signal provided from a processor, such as processor 10.

Frequency up converter 40 is operative to increase the frequency of the amplified signals provided from VGA 30. According to an exemplary embodiment, frequency up converter 40 is operative to convert the frequency of the amplified signals provided from VGA 30 to radio frequency (RF) and/or microwave signals.

Power amplifier 50 is operative to amplify the power of the signals provided from frequency up converter 40, and thereby generate amplified transmission signals. According to an exemplary embodiment, power amplifier 50 comprises a plurality of cascaded stages, and generally requires linearity between its input power and output power. According to principles of the present invention, a bias current of the final stage of power amplifier 50 may be adaptively controlled based on the type of digital modulation used by transmitter apparatus 100, which may significantly reduce the power consumption of power amplifier 50. Further details of power amplifier 50 will be provided later herein.

DAC 60 is operative to convert signals from a digital format to an analog format. According to an exemplary embodiment, DAC 60 is operative to convert digital values provided from processor 10 to analog signals which are used to control a bias current associated with power amplifier 50.

Signal transmitting element 70 is operative to transmit the amplified transmission signals provided from power amplifier 50, and may be embodied as any type of signal transmitting element such as an antenna, output terminal and/or other element. According to an exemplary embodiment, signal transmitting element 70 is operative to wirelessly transmit signals.

Figure 2:
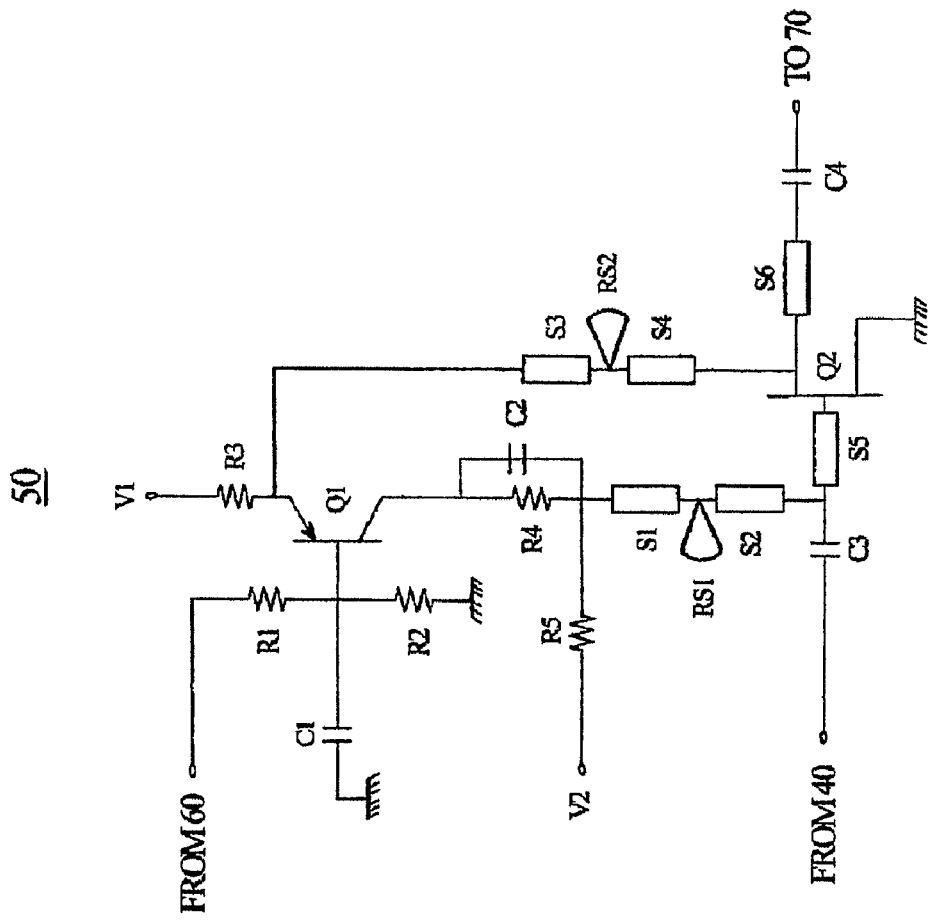
FIG. 2 is a diagram illustrating further exemplary details of the power amplifier of FIG. 1.

Referring now to FIG. 2, further exemplary details of power amplifier 50 of FIG. 1 are provided. In particular, FIG. 2 shows the final stage of a plurality of cascaded stages (e.g., 3 stages) of power amplifier 50 according to an exemplary embodiment of the present invention. In FIG. 2, power amplifier 50 comprises capacitors C1 to C4, transistors Q1 and Q2, radial stubs RS1 and RS2, resistors R1 to R5, quarter wavelength stubs S1 to S6, and voltage inputs V1 and V2. As indicated in FIG. 2, power amplifier 50 also includes input terminals for receiving inputs from frequency up converter 40 and DAC 60, and an output terminal for providing an output to signal transmitting element 70. According to an exemplary embodiment, transistor Q2 is a field effect transistor (FET) constructed using GaAs. The specific values selected for the elements of power amplifier 50 may be a matter of design choice.

Figure 3:
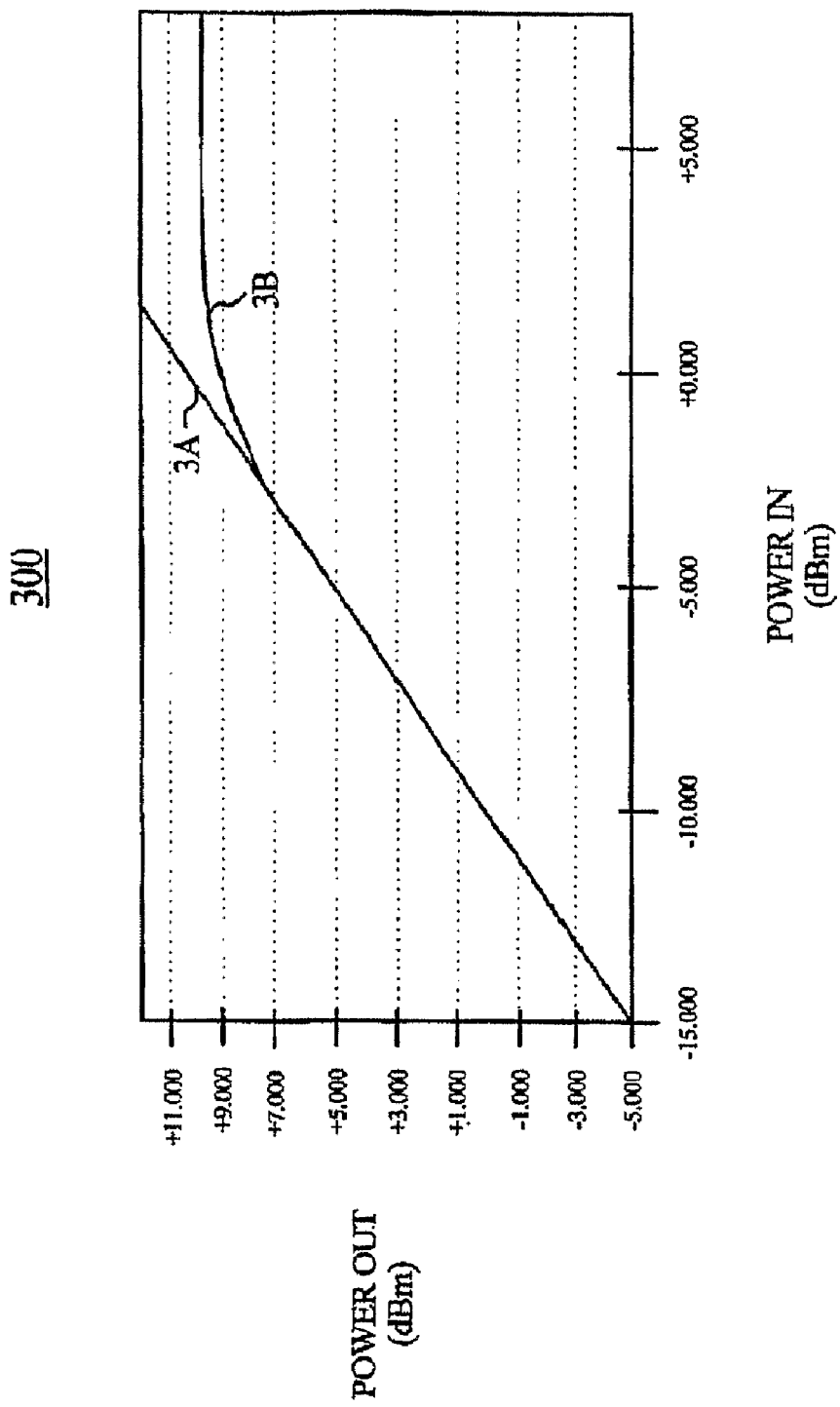
FIG. 3 is a graph illustrating exemplary power input/output characteristics.

Transmitter apparatus 100 of FIG. 1 includes a parameter known as the "crest factor" (also known as the "back-off") which is defined as the ratio between its peak output power and average output power. The crest factor is related to another parameter known as the "compression point" which represents a saturation point where the linear gain of transmitter apparatus 100 has been reduced by 1 dB. In other words, the compression point indicates the introduction of non-linear effects between input power and output power. Such non-linear effects are shown in FIG. 3 which provides a graph 300 illustrating exemplary power input/output characteristics. As shown in FIG. 3, line 3A shows a linear relationship between input power and output power (i.e., gain of 10 dB), while line 3B shows the introduction of non-linear effects between input power and output power.

According to principles of the present invention, it has been determined that the crest factor varies based on the type of digital modulation used for transmission. Tables 2 to 4 below provide simulation results illustrating how the crest factor may vary depending on the type of digital modulation employed.

TABLE 2

| 64 QAM ¾ | | |
|---|---|---|
| Crest Factor (dB) | SNR@10$^{-4}$ BER | Loss (dB) |
| Infinite | 18.2 | |
| 10.0 | 18.4 | 0.2 |
| 9.0 | 18.7 | 0.5 |
| 8.0 | 19.3 | 1.1 |
| 7.0 | 21.2 | 3.0 |
| 6.0 | 25.9 | 7.7 |

TABLE 3

| 16 QAM ¾ | | |
|---|---|---|
| Crest Factor (dB) | SNR@10$^{-4}$ BER | Loss (dB) |
| Infinite | 12.5 | |
| 9.0 | 12.6 | 0.1 |
| 8.0 | 12.6 | 0.1 |
| 7.0 | 12.6 | 0.1 |
| 6.0 | 13.0 | 0.5 |
| 5.0 | 13.9 | 1.4 |

TABLE 4

| QPSK ¾ | | |
|---|---|---|
| Crest Factor (dB) | SNR@10$^{-4}$ BER | Loss (dB) |
| Infinite | 6.2 | |
| 8.0 | 6.3 | 0.1 |
| 7.0 | 6.3 | 0.1 |
| 6.0 | 6.4 | 0.2 |
| 5.0 | 6.5 | 0.3 |
| 4.0 | 6.6 | 0.4 |

In Tables 2 to 4 above, the losses correspond to values deduced from the signal-to-noise ratio (SNR) of an ideal transmitter power amplifier (with infinite back-off) for a targeted bit error rate (BER) of 10$^{-4}$ at the output of a transceiver which includes transmitter apparatus 100, and signal receiving and processing elements (not shown in FIG. 1). Assuming an admitted loss up to 0.5 dB, Tables 2 and 4 indicate that the crest factor may vary 5.0 dB between the 64 QAM ¾ modulation type and the QPSK ¾ modulation type.

The variation of the crest factor based on the type of digital modulation, as represented in Tables 2 to 4, indicates that the compression point may also vary depending on the type of digital modulation. With transmitter apparatus 100, power amplifier 50 may be responsible for defining the compression point. In particular, it may be the final stage of power amplifier 50 shown in FIG. 2 which primarily defines the compression point for transmitter apparatus 100. According to principles of the present invention, the bias current of the final stage of power amplifier 50 shown in FIG. 2 may be decreased (thereby decreasing the compression point) when decreasing the efficiency per bit of the digital modulation, such as when changing the modulation from 64 QAM ¾ to BPSK ½. By decreasing the bias current, the power consumption of power amplifier 50 is reduced which may be particularly beneficial for apparatuses such as mobile transceivers which employ a battery power supply. The reduction of power consumption may also help reduce the generation of undesirable heat.

The following example illustrates how power consumption may be reduced according to the present invention. Consider a transceiver which includes transmitter apparatus 100 and that uses a half duplex mode in which the transmission time is 50%. Assume that the total power consumption of the transceiver in the transmitting mode is 200 mA, which includes the bias current of the final stage of power amplifier 50. Further assume that the estimated bias current of the final stage of power amplifier 50 is 150 mA when 64 QAM ¾ modulation is used, and is 100 mA when BPSK ½ modulation is used. Accordingly, a current reduction of 50 mA is achieved when the transceiver is switched from 64 QAM ¾ modulation to BPSK ½ modulation. This current reduction corresponds to 25% of the total power consumption in the transmitting mode, which corresponds to a total reduction of 12.5% given the transmission time of 50%.

According to principles of the present invention, the bias current of the final stage of power amplifier 50 shown in FIG. 2 may also be increased (thereby increasing the compression point) when increasing the efficiency per bit of the digital modulation, such as when changing the modulation from BPSK ½ to 64 QAM ¾. In this manner, the present invention controls the bias current of the final stage of power amplifier 50 in an adaptive manner and may thereby optimize the bias current for the particular type of digital modulation employed.

Figure 4:
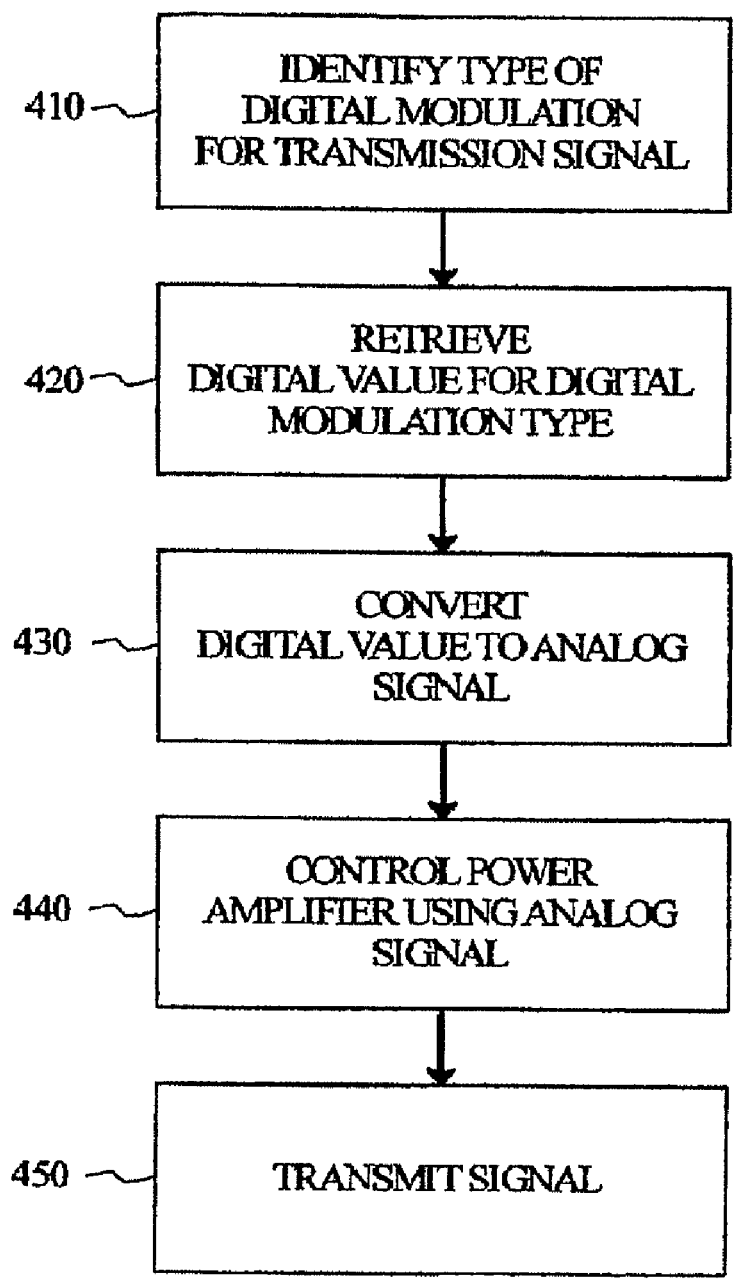
FIG. 4 is a flowchart illustrating steps according to an exemplary embodiment of the present invention.

To facilitate a better understanding of the inventive concepts of the present invention, a more concrete example will now be provided. Referring now to FIG. 4, a flowchart 400 illustrating steps according to an exemplary embodiment of the present invention is shown. For purposes of example and explanation, the steps of FIG. 4 will be described with reference to transmitter apparatus 100 of FIG. 1 and power amplifier 50 of FIG. 2. The steps of FIG. 4 are merely exemplary, and are not intended to limit the present invention in any manner.

At step 410, the type of digital modulation for a transmission signal is identified. According to an exemplary embodiment, processor 10 identifies the type of digital modulation at step 410 by detecting and processing data included within one or more data frames provided from one or more signal receiving and processing elements (not shown in FIG. 1) associated with transmitter apparatus 100. As previously indicated herein, the type of digital modulation used by transmitter apparatus 100 may for example change based on factors such as transmission range, the amount of data to be transmitted, and/or other factors.

At step 420, a digital value is retrieved for the type of digital modulation identified at step 410. According to an exemplary embodiment, processor 10 retrieves the digital value at step 420 from memory 10, and the digital value is based on the crest factor associated with the type of digital modulation identified at step 410. Table 5 below shows exemplary types of digital modulation and corresponding crest factor values which may be used according to the present invention.

TABLE 5

| Modulation Type | Crest Factor (dB) |
|---|---|
| BPSK ½ | 4 |
| BPSK ¾ | 4 |
| QPSK ½ | 4 |
| QPSK ¾ | 4 |
| 16 QAM ½ | 6 |
| 16 QAM ¾ | 6 |
| 64 QAM ⅔ | 9 |
| 64 QAM ¾ | 9 |

As indicated in Table 5, modulation types having higher efficiency per bit tend to have higher crest factor values. Accordingly, the digital value retrieved at step 420 may likewise vary based on the modulation type. The crest factors shown in FIG. 5 are examples only, and other values may also be used according to the present invention.

At step 430, the digital value retrieved at step 420 is converted to an analog signal. According to an exemplary embodiment, DAC 60 receives the digital value retrieved by processor 10 at step 420, and converts the digital value to a corresponding analog signal.

At step 440, the analog signal generated at step 430 is used to control power amplifier 50. According to an exemplary embodiment, the analog signal provided from DAC 60 is applied to power amplifier 50 to thereby control the bias current of the final stage of power amplifier 50 (see FIG. 2). As previously indicated herein, the bias current of the final stage of power amplifier 50 may be controlled in an adaptive manner to thereby optimize the bias current for the particular type of digital modulation employed. Accordingly, the bias current of the final stage of power amplifier 50 shown in FIG. 2 may be decreased when decreasing the efficiency per bit of the digital modulation (e.g., when changing the modulation from 64 QAM ¾ to BPSK ½), and likewise may be increased when increasing the efficiency per bit of the digital modulation (e.g., when changing the modulation from BPSK ½ to 64 QAM ¾).

At step 450, the amplified transmission signal from power amplifier 50 is transmitted. According to an exemplary embodiment, signal transmitting element 70 wirelessly transmits the amplified transmission signal. The steps of FIG. 4 may be performed in an iterative manner such that processor 10 may detect any change to the type of digital modulation used by transmitter apparatus 100, and the bias current of the final stage of power amplifier 50 may be controlled in an adaptive manner based on the type of digital modulation employed.

As described herein, the present invention provides a technique for controlling a transmission apparatus which advantageously reduces power consumption. Accordingly, the principles of the present invention may be particularly applicable to apparatuses such as mobile transceivers which employ a battery power supply. The reduction of power consumption may also help reduce the generation of undesirable heat by such apparatuses.

While this invention has been described as having a preferred design, the present invention can be further modified within the spirit and scope of this disclosure. This application is therefore intended to cover any variations, uses, or adaptations of the invention using its general principles. For example, the principles of the present invention may be applied to apparatuses or devices which support communication standards other than the exemplary Hiperlan2, IEEE 802.11a and DVB-T standards mentioned herein. Further, this application is intended to cover such departures from the present disclosure as come within known or customary practice in the art to which this invention pertains and which fall within the limits of the appended claims. As such, it is intended that the present invention only be limited by the terms of the appended claims.

The invention claimed is:

1. An apparatus, comprising modulating means for performing multi-carrier modulations wherein it further comprises:
    memory means for storing digital values based upon the crest factors associated with a plurality of types of modulation;
    processing means for retrieving a digital value based on the crest factor corresponding to the type of modulation associated with a transmission signal from said memory means;
    converting means converting said retrieved digital value based on the crest factor corresponding to the type of modulation associated with a transmission signal to an analog signal;
    amplifying means for amplifying the transmission signal controlled by the analog signal converted from said retrieved digital value based on the crest factor corresponding to the type of modulation associated with a transmission signal, decreasing bias current when decreasing the efficiency per bit of the digital modulation and vice versa.

2. The apparatus of claim 1, further comprising signal transmitting means for wirelessly transmitting said transmission signal.

3. The apparatus of claim 1, wherein said type of modulation includes one of:
    bi-phase shift keyed modulation;
    quadrature phase shift keyed modulation; and
    quadrature amplitude modulation.

4. The apparatus of claim 1, wherein said transmitter apparatus is part of a mobile transceiver having a battery power supply.

5. A method for controlling a transmitter apparatus, comprising:
    storing digital values based upon crest factors associated with a plurality of types of modulation;
    identifying and retrieving a stored digital value based on the crest factor corresponding to a type of digital modulation for a transmission signal;
    converting said retrieved digital value based on the crest factor corresponding to a type of digital modulation for a transmission signal to an analog signal; and
    controlling power amplification of said transmission signal using said analog signal converted from said retrieved digital value based on the crest factor corresponding to a type of digital modulation for a transmission signal in decreasing a bias current of the amplifier when decreasing the efficiency per bit of the digital modulation and vice versa.

6. The method of claim 5 further comprised of wirelessly transmitting said transmission signal.

7. The method according to claim 5 wherein bias current is decreased when digital modulation is changed from 64 QAM 3/4 to BPSK 1/2.

8. The method according to claim 5 wherein it is in compliance with one of the standards belonging to the set comprising:
    Hiperlan type 2;
    IEEE 802.11a; and
    DVB-T 802.16a.

9. The method of claim 5, wherein said type of digital modulation includes one of:
    bi-phase shift keyed modulation;
    quadrature phase shift keyed modulation; and
    quadrature amplitude modulation.

10. An apparatus, comprising:
    a memory for storing digital values based upon the crest factors associated with a plurality of types of modulation;
    a processor for retrieving a digital value based on the crest factor corresponding to the type of modulation associated with a transmission signal from said memory;
    a digital analog converter converting said retrieved digital value based on the crest factor corresponding to the type of modulation associated with a transmission signal to an analog signal;
    a power amplifier for amplifying the transmission signal controlled by the analog signal converted from said retrieved digital value based on the crest factor corresponding to the type of modulation associated with a transmission signal, decreasing bias current when decreasing the efficiency per bit of the digital modulation and vice versa.

11. The apparatus of claim 10, further comprising a signal transmitting element operative to wirelessly transmit said transmission signal.

12. The apparatus of claim 10, wherein said type of digital modulation includes one of:
    bi-phase shift keyed modulation;
    quadrature phase shift keyed modulation; and
    quadrature amplitude modulation.

13. The apparatus of claim 10, further comprising a modulator operative to perform a plurality of different types of digital modulation.

14. The apparatus of claim 10, wherein said apparatus is embodied as a mobile transceiver having a battery power supply.

* * * * *